United States Patent
Wang

(10) Patent No.: US 8,401,130 B2
(45) Date of Patent: *Mar. 19, 2013

(54) AUTOMATIC GAIN CONTROL METHOD AND APPARATUS FOR WIRELESS COMMUNICATION SYSTEMS

(75) Inventor: Haitao Wang, Shanghai (CN)

(73) Assignee: Adaptix, Inc., Carrollton, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/220,401

(22) Filed: Aug. 29, 2011

(65) Prior Publication Data

US 2011/0311006 A1     Dec. 22, 2011

Related U.S. Application Data

(63) Continuation-in-part of application No. 11/651,235, filed on Jan. 9, 2007, now Pat. No. 8,023,598.

(30) Foreign Application Priority Data

Nov. 30, 2006  (CN) .......................... 2006 1 0160846

(51) Int. Cl.
*H04L 27/08* (2006.01)
(52) U.S. Cl. ..................................... 375/345; 455/250.1
(58) Field of Classification Search .................. 375/345; 455/136, 250.1

See application file for complete search history.

(56) References Cited

U.S. PATENT DOCUMENTS

| | | | |
|---|---|---|---|
| 4,989,074 A | 1/1991 | Matsumoto | |
| 5,566,201 A | 10/1996 | Ostman | |
| 5,732,334 A | 3/1998 | Miyake | |
| 5,946,607 A | 8/1999 | Shiino et al. | |
| 6,081,558 A * | 6/2000 | North | ............................ 375/316 |
| 6,668,027 B1 | 12/2003 | Scarpa | |
| 6,795,559 B1 | 9/2004 | Taura et al. | |
| 7,027,530 B2 | 4/2006 | McFarland et al. | |
| 7,409,018 B2 | 8/2008 | Kim | |
| 7,660,344 B2 * | 2/2010 | Haghighat | .................... 375/222 |
| 8,023,598 B2 | 9/2011 | Wang | |
| 2002/0141517 A1 | 10/2002 | Hayashi | |
| 2003/0026363 A1 | 2/2003 | Stoter et al. | |
| 2005/0130687 A1 | 6/2005 | Filipovic et al. | |
| 2006/0166633 A1 | 7/2006 | Mehr | |
| 2006/0222118 A1 | 10/2006 | Murthy et al. | |

FOREIGN PATENT DOCUMENTS

CN 1158677 4/1996
WO WO-PCT/US1995/012180 4/1996

OTHER PUBLICATIONS

International Search Report and Written Opinion issued for PCT Application PCT/US2007/085695, Dated: May 13, 2008, 9 pages.
English Translation of Office Action issued for Chinese Application: 200610160846.7 dated Jul. 14, 2011, 3 pgs.

* cited by examiner

*Primary Examiner* — Jean B Corrielus
(74) *Attorney, Agent, or Firm* — Martin & Ferraro, LLP

(57) ABSTRACT

A system and method are provided for automatic gain control (AGC) using an adaptive reference and a threshold. An adaptive reference allows for adjusting the target power based on variations in operating parameters and conditions, such as a change to a modulation schemes which requires a different signal to noise ratio (SNR) to maintain performance. A gain adjustment threshold allows for rapid AGC response while reducing the potential effects of hysterisis. AGC levels may be changed during symbol prefixes or suffixes, and avoided during a data portion of a signal. Embodiments allow for symbol-by symbol AGC changes in OFDM, OFDMA, and TDD systems.

18 Claims, 2 Drawing Sheets

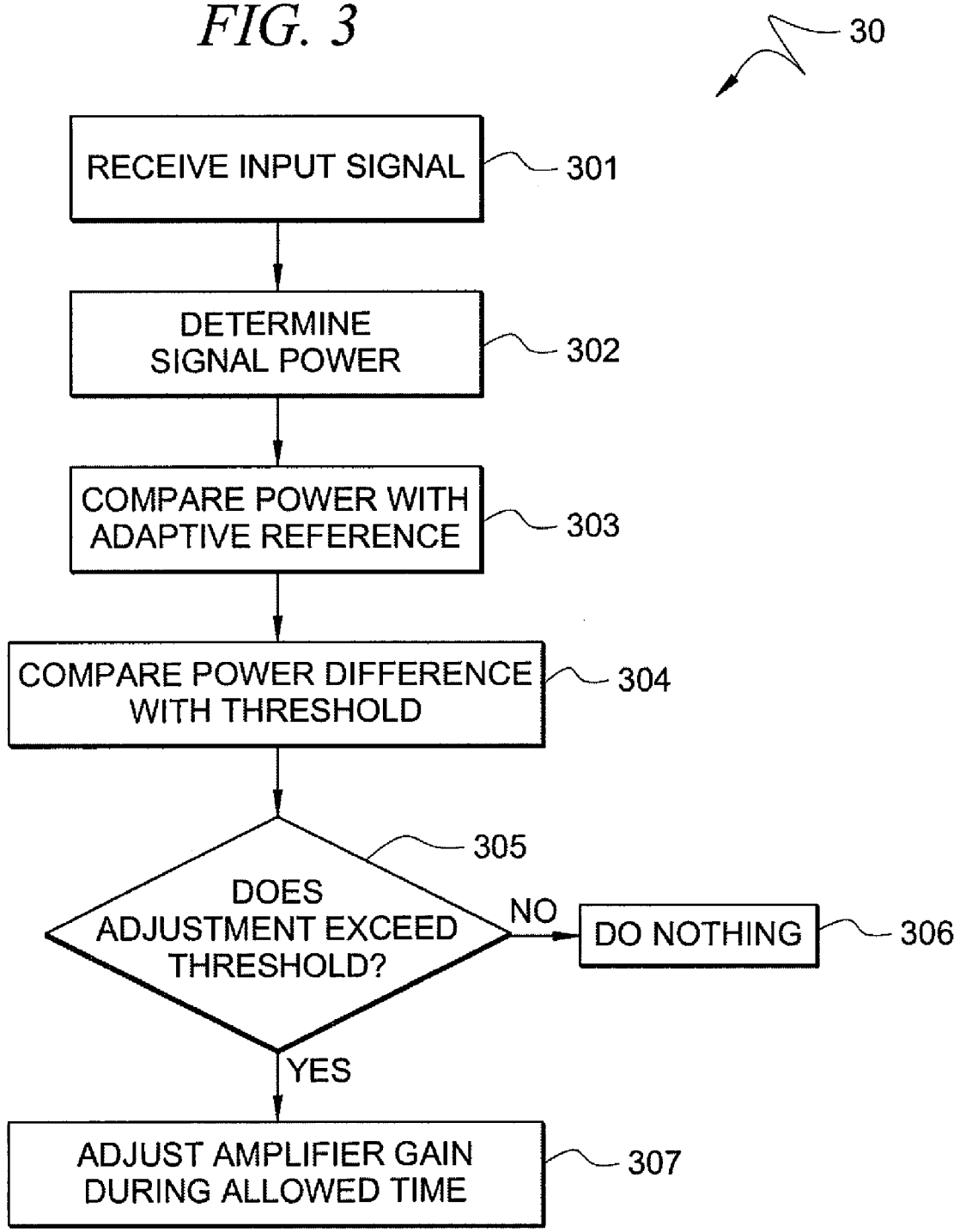

AUTOMATIC GAIN CONTROL METHOD AND APPARATUS FOR WIRELESS COMMUNICATION SYSTEMS

CROSS-REFERENCE TO RELATED APPLICATIONS

This application is a continuation of U.S. patent application Ser. No. 11/651,235, filed Jan. 9, 2007, now U.S. Pat. No. 8,023,598, entitled "AUTOMATIC GAIN CONTROL METHOD AND APPARATUS FOR WIRELESS COMMUNICATION SYSTEMS, which is related to and claims priority to Chinese Application No. 200610160846.7 filed Nov. 30, 2006 entitled "AUTOMATIC GAIN CONTROL METHOD AND APPARATUS FOR WIRELESS COMMUNICATION SYSTEMS," the disclosures of which are incorporated herein by reference.

TECHNICAL FIELD

The present invention relates generally to wireless communication, and more particularly to automatic gain control (AGC) for wireless systems.

BACKGROUND OF THE INVENTION

Fast fading channels can present dynamic range challenges for symbol based wireless systems, such as orthogonal frequency division multiplexing (OFDM), orthogonal frequency division multiple access (OFDMA), and time division duplex (TDD) systems with frame-based AGC. Problems exist because signal strength may fluctuate significantly during a frame which contains multiple symbols, resulting in differing signal to noise ratios (SNRs) among symbols. Further compounding the challenges are differing SNR requirements for various common modulation schemes.

For example, 16 quadrature amplitude modulation (16 QAM) will have poorer bit error rate (BER) performance than quadrature phase shift keying (QPSK) for a given SNR. To compensate for this difference, the SNR requirement for 16 QAM is higher than it would be for QPSK. For a system that uses multiple modulation schemes, meeting a minimum performance level may require significant dynamic range in order to accommodate the differing SNR requirements over fading channels.

In order to maintain an acceptable SNR within a system's dynamic range, receivers often employ AGC. Traditionally, AGC circuits control the gain of a variable gain amplifier to maintain an amplified signal within a target power range. By comparing the amplified signal power to a reference, a determination can be made as to whether the amplifier should be adjusted to provide more gain or less gain. A control signal then causes the gain adjustment. Since the feedback loop has a time lag, if power adjustments are made too quickly, the feedback loop may become an oscillator which could introduce a ping-pong effect in the power level. To combat this, TDD-OFDM systems often adjust gain on a relatively slow, frame-by-frame basis, presenting the above-mentioned problem of differing symbol SNRs.

BRIEF SUMMARY OF THE INVENTION

An adaptive AGC reference allows for adjusting signal power based on system needs when operating on a certain type of signal. For example, when a higher signal power is required, possibly due to changing the modulation scheme to one requiring a higher SNR, the adaptive reference may be increased. Conversely, the adaptive reference may be lowered when system performance will allow, such as when using a more robust modulation scheme.

A gain adjustment threshold, which prevents small changes in amplifier gain, introduces a non-linearity in the AGC feedback loop. This reduces the likelihood of feedback-induced oscillations or a ping-pong effect, allowing symbol-based AGC, which provides for more consistent symbol SNRs. By adjusting the gain only during a symbol prefix or suffix, the gain level is not altered over the data, resulting in more consistent demodulation. Embodiments of the invention provide for symbol-based AGC by determining a power level, comparing the power level with an adaptive reference to determine a target gain change, comparing the target gain change with a threshold, and only adjusting signal gain if the target gain change exceeds the threshold.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which:

FIG. 3 shows an embodiment of a method for AGC in accordance with the present invention.

DETAILED DESCRIPTION OF THE INVENTION

Figure 1:
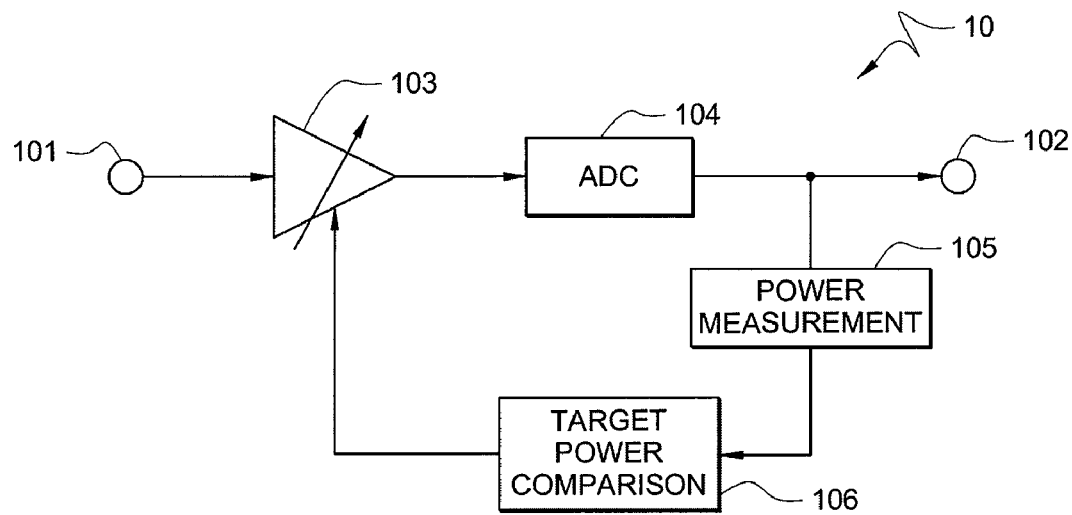
FIG. 1 shows a prior art AGC circuit using a traditional implementation.

FIG. 1 shows prior art AGC circuit 10 using a traditional implementation. AGC 10 controls the gain applied to signals arriving at input 101 in order to maintain a target power level at output 102. Analog to digital converter (ADC) 104 digitizes the amplified signal, and provides the digital signal to both output 102 and power measurement unit 105. The measured power is then compared to a target power level by target power comparison subsystem 106. The result of this comparison is then fed back to variable amplifier 103 as a gain adjustment signal. Typically, gain may be adjusted on a frame-by-frame basis.

Figure 2:
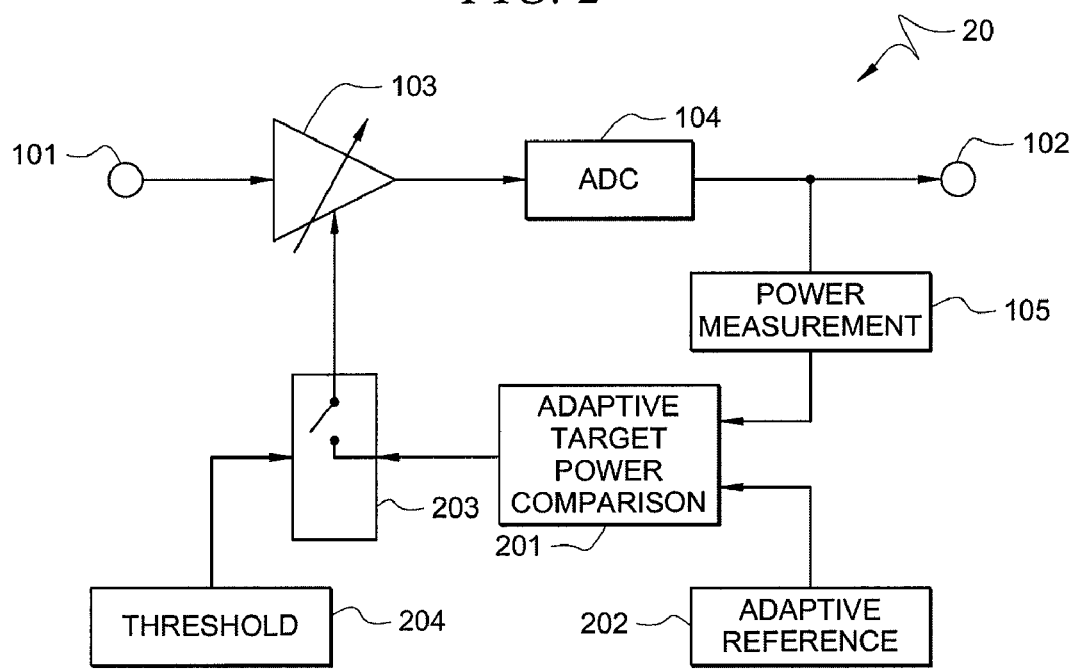
FIG. 2 shows an embodiment of an AGC circuit in accordance with the present invention.

FIG. 2 shows AGC circuit 20, according to an embodiment of the invention. AGC 20 controls the gain applied to signals arriving at input 101 in order to maintain a target power level at output 102. Specifically, the gain of variable amplifier 103 is adjusted based on feedback from adaptive target power comparison subsystem 201. Optional analog to digital converter (ADC) 104 digitizes the amplified signal, and provides the signal to both output 102 and power measurement unit 105. The function of power measurement unit 105 may be provided by any known method for determining power level, including, for example, estimation. Adaptive reference 202 may change based the modulation scheme being used, or it may change based on an operating parameter or condition that affects system performance, such as noise levels. For example, a change from QPSK to 16 QAM could require the increase of adaptive reference 202 by 4 to 6 dB. The result of the comparison, which is target gain change, is then compared to threshold 204, in threshold trigger 203. If the target gain change identified in comparison unit 201 exceeds the threshold, then the gain of variable amplifier 103 is adjusted.

Threshold 204 may provide separate values for increasing and decreasing gain, and may be defined in terms of ratios or absolute differences. A threshold is a condition that must be met order for an event to occur. Threshold 204 is chosen to allow changes in gain levels that are determined to be significant enough to warrant change, while insignificant gain level changes that fall below threshold 204 may be prevented from occurring. The setting of threshold 204 may be made based on engineering decisions or historical performance data. Since feedback systems often introduce a lag between identifying a need for a change, and the change taking effect, they risk producing undesirable oscillations with frequencies related to the lag period. In general, threshold trigger 203 is a non-linear device, which may reduce oscillations in output power. Threshold 204 may itself be adjusted based on whether hysterisis is detectable in the output signal. For example, if power oscillations due to the AGC lag time are identifiable, the values in threshold 204 may be adjusted either up or down in order to perturb the feedback cycle. Additionally, threshold 204 may be adjusted based on conditions of the input signal, such as how rapidly or significantly it varies.

AGC 20 may adjust gain on a symbol-by-symbol basis, which provides a more consistent symbol power level as compared with frame-by-frame adjustment. With a fast fading channel and frame-by-frame adjustment, a frame, which contains multiple symbols, may have some symbols with higher signal power than others, resulting in differing SNRs for the symbols as well as a potentially wide dynamic range. However, adjusting gain too often, such as during the symbol, may cause ambiguities during demodulation. Thus, AGC 20 may limit the time-frame for gain adjustment to a symbol prefix or a cyclic prefix (CP), such that gain is constant during the data portion of the signal. In an OFDM system, for example, a CP may last 10 microseconds (µs) and precedes the data portion, which may last 100 µs. For OFDMA, the CP follows the data portion of the signal.

FIG. 3 shows method 30 which is one embodiment for providing AGC according to an embodiment of the invention. An input signal is received during process 301, and its power is determined in process 302. The power level may be determined by either measurement or estimation. The signal power level is then compared with an adaptive reference by process 303. The adaptive reference may change in response to identified or expected system performance needs or parameter changes, such as variations in the modulation scheme, estimated interference level, or any other need for adjusting SNR.

Process 304 compares the result of process 303 with a threshold. The threshold itself may be varied, based on whether gain may be safely adjusted more often, or whether a ping-pong effect is occurring in the output signal. A determination is made in process 305 as to whether the threshold is exceeded. If it is not, process 306 does nothing. If the threshold is exceeded, then process 307 adjusts gain. Gain may be adjusted on a symbol-by symbol basis during a symbol prefix or a CP, but held constant during the data portion of the signal.

Embodiments of the invention thus provide symbol-based AGC with an adaptive reference. The adaptive reference may be based on the modulation scheme in use, such that when the modulation changes to a one that needs higher signal power to maintain a particular performance level, such as a minimum BER, a higher power reference is used. Conversely, the power reference may be lowered when the modulation changes to one that does not require as much signal power to maintain a particular performance level. Symbol-based AGC may provide more consistent SNR levels than frame-based AGC for fast fading channels, due to the more rapid response in gain adjustment.

Embodiments of the invention also provide for an AGC adjustment threshold, such that the AGC level is not adjusted when the amount of gain change is below the threshold. Minor power fluctuations may occur rapidly, possibly producing a ping-pong effects, or power-level oscillations, if the AGC is allowed to vary too rapidly. The threshold limits prevents AGC level adjustment during minor fluctuations, limiting AGC level adjustment to the more serious power fluctuations. Adjustment of the gain may be accomplished during a symbol prefix or suffix, so that the gain level is established and is not altered for the data. Embodiments of the invention may simultaneously provide symbol-based AGC with an adaptive reference and a threshold.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of automatic gain control (AGC) for a signal, said method comprising:
   determining a power level of said signal;
   comparing said power level with an adaptive reference to determine a target gain change, wherein said adaptive reference increases when a modulation change of said signal requires additional signal power to maintain a performance level and said adaptive reference decreases when said modulation change of said signal requires less power to maintain said performance level; and
   adjusting amplification of said signal based on said target gain change, if said target gain change exceeds a threshold.

2. The method of claim 1 wherein said threshold is a threshold for increasing gain or decreasing gain.

3. The method of claim 1 further comprising: adjusting said reference in response to a change in operating parameters or conditions.

4. The method of claim 3 wherein said change in operating parameters or conditions is a change in a modulation scheme.

5. The method of claim 1 wherein said adjusting amplification occurs outside a data portion of said signal.

6. The method of claim 1 wherein said adjusting amplification occurs on a symbol-by-symbol basis.

7. The method of claim 1 wherein said signal is selected from the list including: time division duplex, orthogonal frequency division multiplexing, and orthogonal frequency division multiple access signals.

8. An apparatus for automatic gain control (AGC) for a signal comprising:
   logic for determining a power level of said signal;
   logic for comparing said power level with an adaptive reference to determine a target gain change, wherein said adaptive reference increases when a modulation change requires additional signal power to maintain a performance level and said adaptive reference decreases when said modulation change requires less power to maintain said performance level;
   logic for comparing said target gain change with a threshold, wherein said threshold is adjusted to avoid detrimental effects in said signal; and
   logic for adjusting amplification of said signal based on said target gain change, if said target gain change exceeds said threshold.

9. The apparatus of claim 8 wherein said threshold is a threshold for increasing gain or decreasing gain.

10. The apparatus of claim 8 wherein said adaptive reference is varied in response to a change in operating condition additional to said modulation change.

11. The apparatus of claim 8 wherein said adjusting amplification occurs outside a data portion of said signal.

12. The apparatus of claim 8 wherein said adjusting amplification occurs on a symbol-by-symbol basis.

13. The apparatus of claim 8 wherein said signal is selected from the list including: time division duplex, orthogonal frequency division multiplexing, and orthogonal frequency division multiple access signals.

14. An automatic gain control (AGC) system comprising:
   a variable gain amplifier;
   a power determination unit coupled to an output of said amplifier;
   an adaptive reference that increases when a modulation change requires additional signal power to maintain a performance level and said adaptive reference decreases when said modulation change requires less power to maintain said performance level;
   a comparison unit operable to compare an output of said power determination unit with said adaptive reference and produce a comparison signal; and
   a threshold trigger coupled to an output of said comparison unit, said trigger operable to prevent adjustment of said variable gain amplifier when a magnitude of said comparison signal is below a threshold.

15. The system of claim 14 wherein said adaptive reference is varied in response to a change in operating condition additional to said modulation change.

16. The system of claim 14 wherein said adjustment of variable gain amplifier occurs on a symbol-by-symbol basis.

17. The system of claim 14 wherein a signal received by said variable gain amplifier is selected from the list including: time division duplex, orthogonal frequency division multiplexing, and orthogonal frequency division multiple access signals.

18. The system of claim 17 wherein said adjustment of variable gain amplifier occurs during a prefix or a suffix of said signal.

* * * * *